US012598998B2

(12) United States Patent
Lin et al.

(10) Patent No.: US 12,598,998 B2
(45) Date of Patent: Apr. 7, 2026

(54) INTERPOSER HAVING INDUCTOR COIL PATTERN EMBEDDED IN BUFFER LAYER AND FABRICATION THEREOF

(71) Applicant: UNITED MICROELECTRONICS CORP., Hsin-Chu City (TW)

(72) Inventors: Da-Jun Lin, Kaohsiung City (TW); Bin-Siang Tsai, Changhua County (TW); Fu-Yu Tsai, Tainan City (TW); Chung-Yi Chiu, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 415 days.

(21) Appl. No.: 18/244,320

(22) Filed: Sep. 11, 2023

(65) Prior Publication Data

US 2025/0054883 A1 Feb. 13, 2025

(30) Foreign Application Priority Data

Aug. 11, 2023 (CN) .......................... 202311010533.3

(51) Int. Cl.
*H10W 44/00* (2026.01)
*H10W 70/65* (2026.01)
*H10W 70/685* (2026.01)

(52) U.S. Cl.
CPC ......... *H10W 44/501* (2026.01); *H10W 70/65* (2026.01); *H10W 70/685* (2026.01)

(58) Field of Classification Search
CPC ............ H01L 23/645; H01L 23/49822; H01L 23/49838; H10W 70/635; H10W 70/685; H10W 70/65; H10W 70/611
See application file for complete search history.

(56) References Cited

U.S. PATENT DOCUMENTS

| | | | |
|---|---|---|---|
| 6,211,056 B1 | 4/2001 | Begley | |
| 8,823,133 B2 | 9/2014 | Jenkins | |
| 2006/0022787 A1* | 2/2006 | Brennan | ............... H01F 41/046 336/200 |
| 2013/0278374 A1* | 10/2013 | Thorslund | ............... H01F 27/29 336/200 |
| 2016/0079339 A1* | 3/2016 | Gambino | .......... H01L 21/76283 257/506 |
| 2022/0346226 A1* | 10/2022 | Onohara | ............... H05K 1/162 |
| 2023/0411281 A1* | 12/2023 | Tanaka | ............. H01L 23/53295 |

\* cited by examiner

*Primary Examiner* — Michael Jung
(74) *Attorney, Agent, or Firm* — Winston Hsu

(57) ABSTRACT

An interposer includes a substrate having an inductor forming region thereon, a plurality of trenches within the inductor forming region in the substrate, a buffer layer lining interior surfaces of the plurality of trenches and forming air gaps within the plurality of trenches, and an inductor coil pattern embedded in the buffer layer within the inductor forming region.

18 Claims, 7 Drawing Sheets

INTERPOSER HAVING INDUCTOR COIL PATTERN EMBEDDED IN BUFFER LAYER AND FABRICATION THEREOF

BACKGROUND OF THE INVENTION

1. Field of the Invention

The invention relates to the field of semiconductor technology, in particular to an improved interposer and a manufacturing method thereof.

2. Description of the Prior Art

With the progress of miniaturization of electronic devices, it is required to integrate high performance capacitors and inductors in a semiconductor device. Many inductors formed on a semiconductor substrate have a spiral shape.

The implementation of on-chip inductors in integrated circuit application remains a challenge to satisfy the requirements of high quality factor (Q factor), small area consumption, limited parasitic coupling, ease of layout, and manufacture.

To improve the Q factor, additional metal layers of an interconnection structure of a chip or a die are typically used in the flip chip package fabrication process. However, the additional metal layers increase on-die area and fabrication costs, and negatively affect fabrication throughput.

SUMMARY OF THE INVENTION

It is one objective of the present invention to provide an improved interposer and its manufacturing method to solve the deficiencies or shortcomings of the prior art.

One aspect of the invention provides an interposer including a substrate having an inductor forming region thereon; a plurality of trenches within the inductor forming region in the substrate; a buffer layer lining interior surfaces of the plurality of trenches and forming air gaps within the plurality of trenches; and an inductor coil pattern embedded in the buffer layer within the inductor forming region.

According to some embodiments, the plurality of trenches within the inductor forming region and the buffer layer in the plurality of trenches are surrounded by a fluorosilicate glass (FSG) layer in the substrate.

According to some embodiments, the buffer layer comprises an organo-silicate glass (OSG) layer.

According to some embodiments, the inductor coil pattern comprises a titanium nitride layer and a copper layer stacked on the titanium nitride layer.

According to some embodiments, the interposer further comprises a dielectric capping layer covering the inductor coil pattern and the buffer layer within the inductor forming region.

According to some embodiments, the dielectric capping layer comprises a silicon nitride layer or a nitrogen-doped silicon carbide layer.

According to some embodiments, the interposer further comprises an etch stop layer disposed on the dielectric capping layer; and an insulating layer disposed on the etch stop layer.

According to some embodiments, the etch stop layer comprises a silicon nitride layer.

According to some embodiments, the interposer further comprises a cavity in the insulating layer within the inductor forming region.

According to some embodiments, the inductor coil pattern comprises a multi-layer metal structure.

Another aspect of the invention provides a method for forming an interposer. A substrate having an inductor forming region thereon is provided. A plurality of trenches is formed within the inductor forming region in the substrate. A buffer layer is formed to line interior surfaces of the plurality of trenches and forming air gaps within the plurality of trenches. An inductor coil pattern embedded in the buffer layer within the inductor forming region is then formed.

According to some embodiments, the plurality of trenches within the inductor forming region and the buffer layer in the plurality of trenches are surrounded by a fluorosilicate glass (FSG) layer in the substrate.

According to some embodiments, the buffer layer comprises an organo-silicate glass (OSG) layer.

According to some embodiments, the inductor coil pattern comprises a titanium nitride layer and a copper layer stacked on the titanium nitride layer.

According to some embodiments, the method further comprises the step of forming a dielectric capping layer covering the inductor coil pattern and the buffer layer within the inductor forming region.

According to some embodiments, the dielectric capping layer comprises a silicon nitride layer or a nitrogen-doped silicon carbide layer.

According to some embodiments, the method further comprises the steps of forming an etch stop layer on the dielectric capping layer; and forming an insulating layer on the etch stop layer.

According to some embodiments, the etch stop layer comprises a silicon nitride layer.

According to some embodiments, the method further comprises the step of forming a cavity in the insulating layer within the inductor forming region.

According to some embodiments, the inductor coil pattern comprises a multi-layer metal structure.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figures 1, 2:
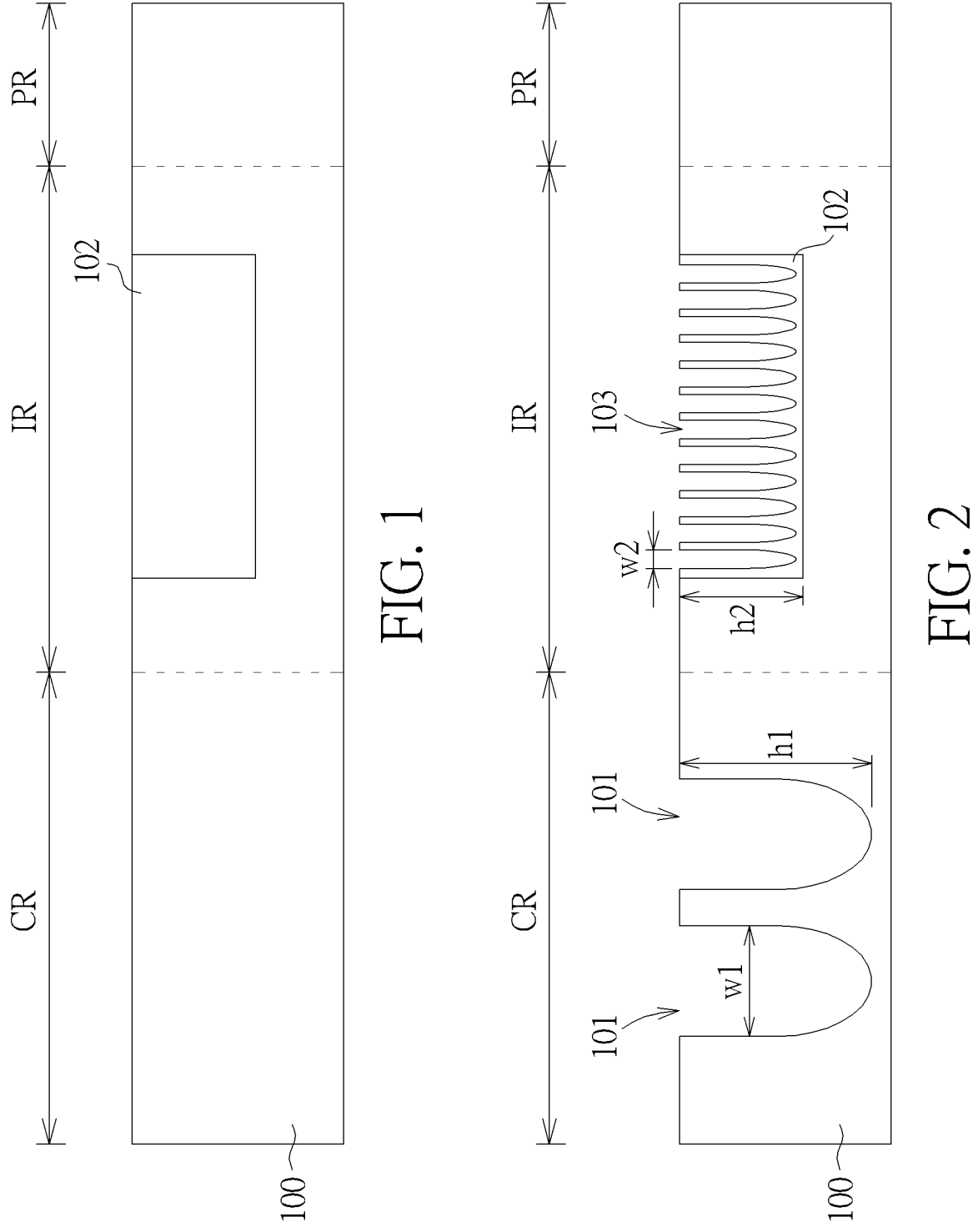
FIG. 1 to FIG. 8 are schematic views of a method for forming an interposer according to an embodiment of the present invention.

Please refer to FIG. 1 to FIG. 8, which are schematic views of a method for forming an interposer according to an embodiment of the present invention. As shown in FIG. 1, a substrate 100 is provided. For example, the substrate 100 may comprise a semiconductor substrate such as a silicon substrate. According to an embodiment of the present invention, the substrate 100 includes a capacitor forming region CR, an inductor forming region IR, and a through silicon via input/output (TSV IO) region PR. According to an embodiment of the present invention, an ion implantation process is performed to implant fluorine ions into the substrate 100 in the inductor forming region IR, thereby forming the fluorine doped region 102.

As shown in FIG. 2, a photolithography process and an etching process are then performed to form a plurality of trenches 101 and a plurality of trenches 103 in the substrate 100. The plurality of trenches 101 and the plurality of trenches 103 are disposed in the capacitor forming region CR and the inductor forming region IR, respectively. According to an embodiment of the present invention, the plurality of trenches 101 have the same width w1, and the plurality of trenches 103 have the same width w2. According to an embodiment of the present invention, the width w1 of the trench 101 is greater than the width w2 of the trench 103. According to an embodiment of the present invention, the plurality of trenches 101 has the same depth h1, and the plurality of trenches 103 has the same depth h2. According to an embodiment of the present invention, the depth h1 of the trench 101 is greater than the depth h2 of the trench 103. According to the embodiment of the present invention, all the trenches 103 are located within the fluorine-doped region 102.

Figures 3, 4:
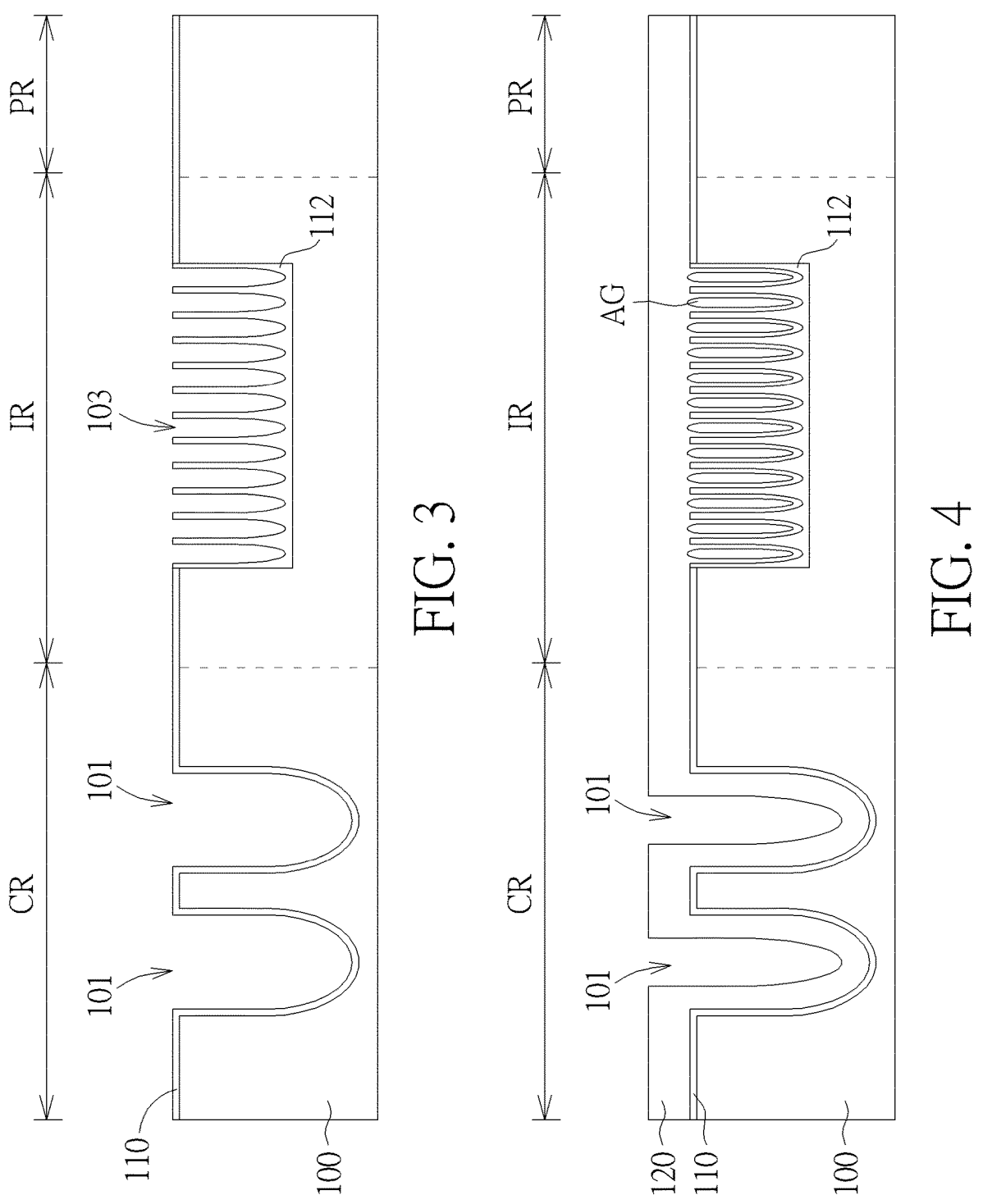

As shown in FIG. 3, an oxidation process is performed to form an oxide layer 110 on the surface of the substrate 100 and transform the fluorine-doped region 102 into a fluorosilicate glass (FSG) layer 112 with a low dielectric constant. At this point, the plurality of trenches 103 may be located in the fluorosilicate glass layer 112. According to an embodiment of the present invention, the oxide layer 110 may be a silicon oxide layer, which is conformally formed on the surface of the substrate 100 and the interior surfaces of the plurality of trenches 101. According to an embodiment of the present invention, the oxide layer 110 is contiguous with the fluorosilicate glass layer 112.

As shown in FIG. 4, a deposition process is then performed to form a buffer layer 120 on the oxide layer 110. According to an embodiment of the present invention, the buffer layer 120 may include an organo-silicate glass (OSG) layer. According to an embodiment of the present invention, the buffer layer 120 lines the interior surfaces of the plurality of trenches 101 and 103, and the buffer layer 120 is thick enough to form air gaps AG within the trenches 103. Since the width w1 of the trench 101 is greater than the width w2 of the trench 103, the buffer layer 120 will not form an air gap in the trenches 101. According to an embodiment of the present invention, the trenches 103 in the inductor forming region IR and the buffer layer 120 in the trenches 103 are surrounded by the fluorosilicate glass layer 112 in the substrate 100.

Figures 5, 6:
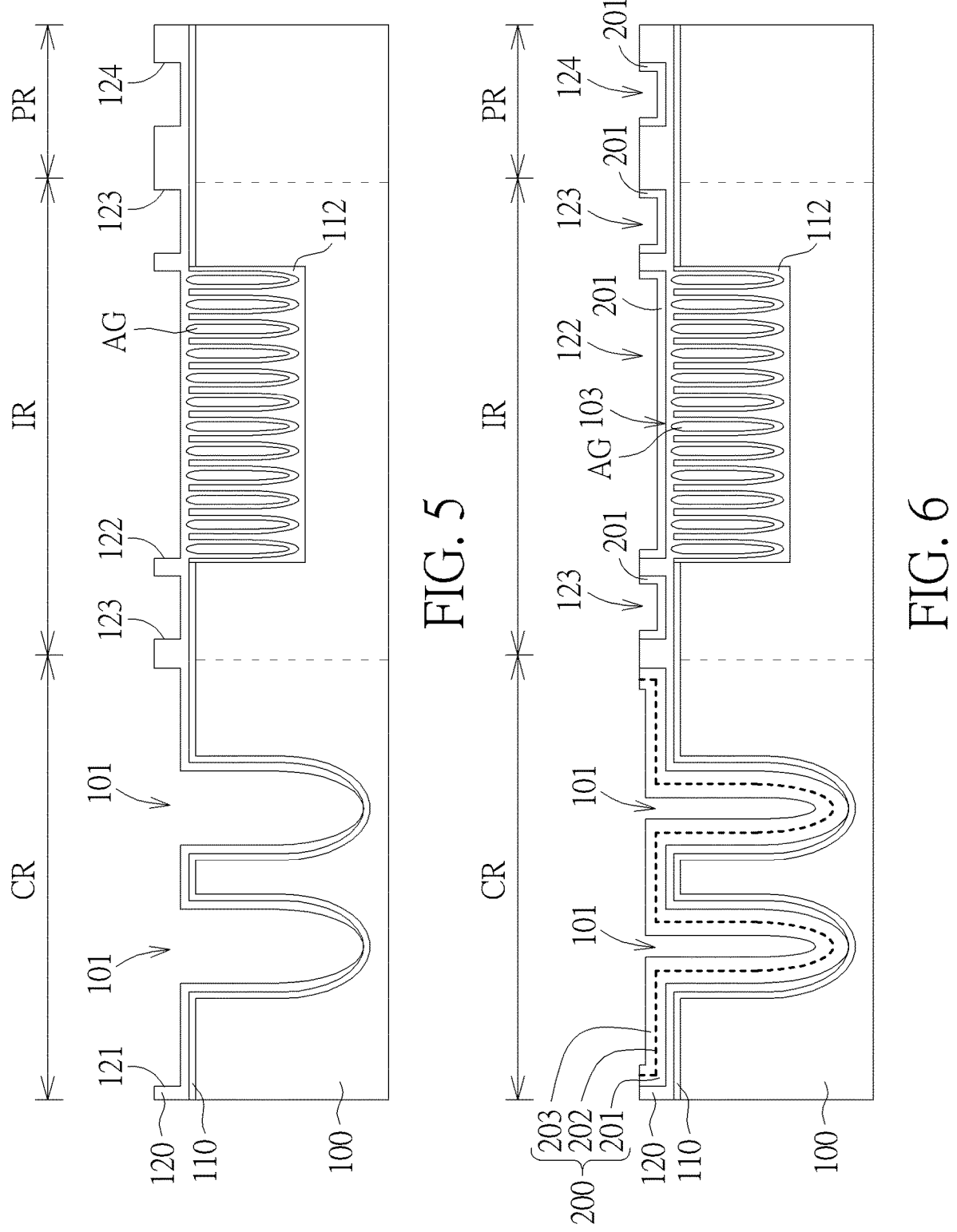

As shown in FIG. 5, a photolithography process and an etching process are then performed to form a capacitor groove pattern 121 in the capacitor forming region CR, and form an inductor groove pattern 122 and a pad groove pattern 123 in the inductor forming region IR. At the same time, a pad groove pattern 124 is formed in the TSV input/output region PR. At this point, the air gaps AG in the trenches 103 within the inductor forming region IR are still sealed by the buffer layer 120.

As shown in FIG. 6, a metal-insulator-metal (MIM) capacitor stack layer 200 is then deposited on the substrate 100 in a blanket manner. According to an embodiment of the present invention, the MIM capacitor stack layer 200 may include a bottom electrode layer 201, a capacitor dielectric layer 202 and a top electrode layer 203. According to an embodiment of the present invention, for example, the bottom electrode layer 201 may include titanium nitride (TIN), but is not limited thereto. According to an embodiment of the present invention, for example, the top electrode layer 201 may include titanium nitride (TiN) or tantalum nitride (TaN), but is not limited thereto. According to an embodiment of the present invention, for example, the capacitor dielectric layer 202 may include hafnium oxide (HfO$_2$), silicon nitride or silicon oxide, but is not limited thereto.

A photolithography process and an etching process are then performed to remove the MIM capacitor stack layer 200 from the inductor forming region IR and the TSV IO region PR. According to an embodiment of the present invention, the bottom electrode layer 201 may remain in the inductor groove pattern 122, the pad groove pattern 123 and the pad groove pattern 124. The bottom electrode layer 201 in the inductor groove pattern 122 and the pad groove pattern 123 and the bottom electrode layer 201 in the capacitor forming region CR are disconnected.

Figure 7:
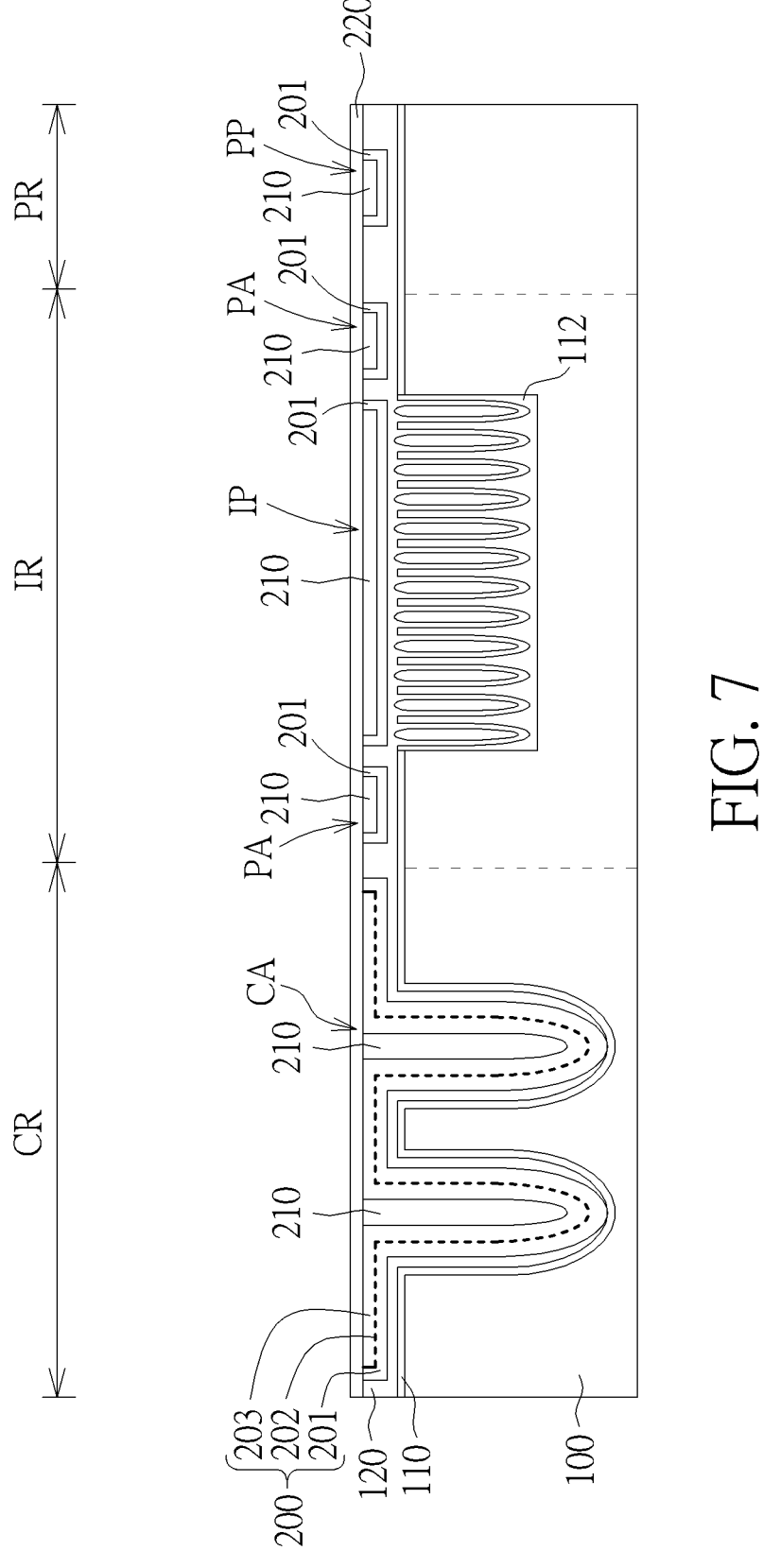

As shown in FIG. 7, a metallization process, such as a copper electroplating process, and a chemical mechanical polishing (CMP) process is performed to fill the copper layer 210 into the trenches 101, the inductor groove pattern 122, the pad groove pattern 123, and the pad groove pattern 124, thereby forming a MIM capacitor structure CA in the capacitor forming region CR, an inductor coil pattern IP and a pad structure PA in the inductor forming region IR, and a pad structure PP in the TSV IO region PR. According to an embodiment of the present invention, the inductor coil pattern IP includes a titanium nitride layer and a copper layer stacked on the titanium nitride layer. According to some embodiments of the present invention, the inductor coil pattern IP may include a multi-layer metal structure.

Subsequently, a dielectric capping layer 220 is deposited in a blanket manner to cover the buffer layer 120, the MIM capacitor structure CA, the inductor coil pattern IP, the pad structure PA and the pad structure PP. According to an embodiment of the present invention, the dielectric capping layer 220 may include a silicon nitride layer or a nitrogen-doped silicon carbide layer, but is not limited thereto.

Figure 8:
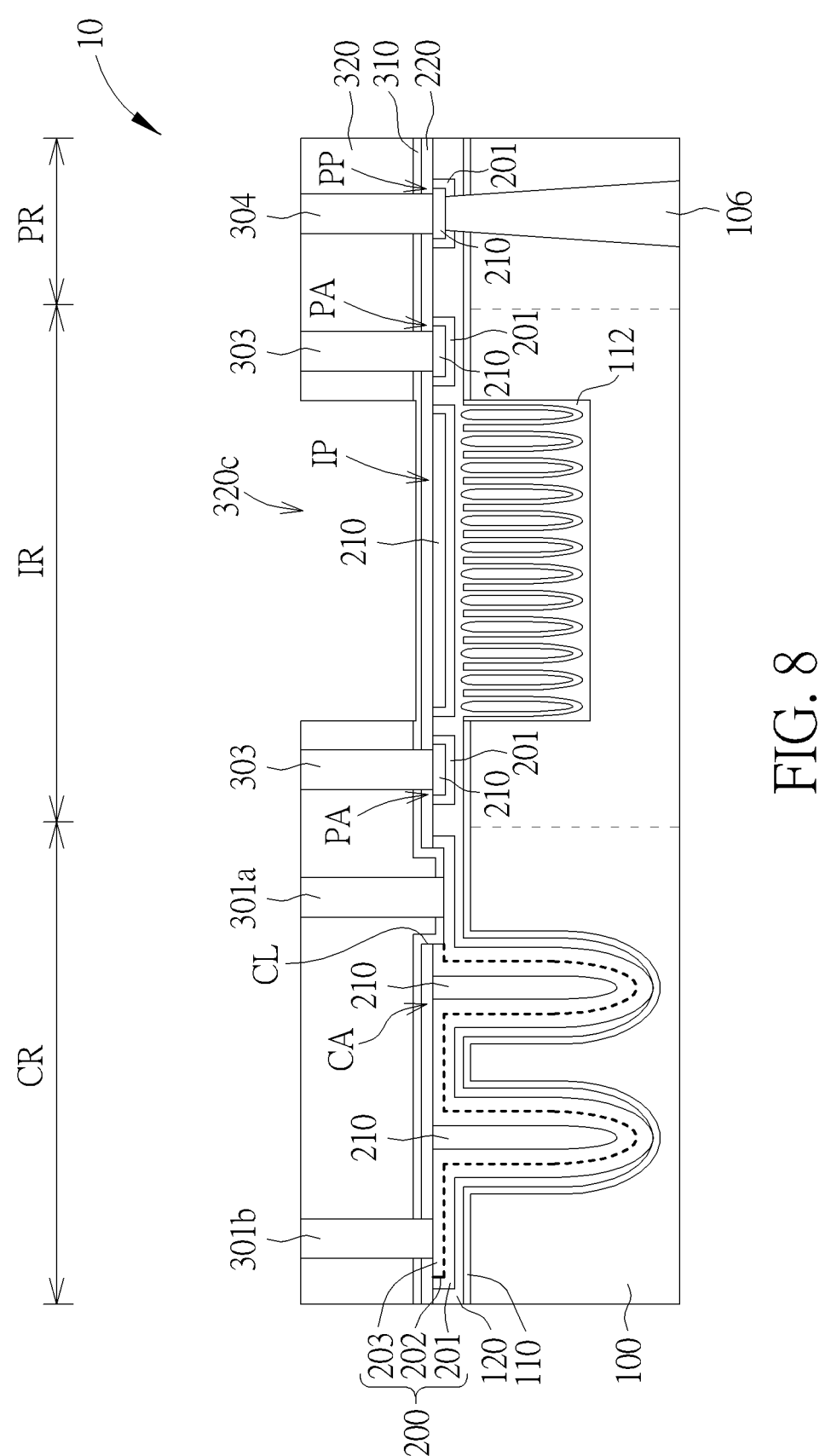

As shown in FIG. 8, a photolithography process and an etching process are then performed to form a contact hole CL connected to the bottom electrode layer 201 in the MIM capacitor stack layer 200 within the capacitor forming region CR, exposing part of the bottom electrode layer 201. Subsequently, an etch stop layer 310 is conformally deposited on the dielectric capping layer 220 and in the contact hole CL. According to an embodiment of the present invention, for example, the etch stop layer 310 may include a silicon nitride layer. An insulating layer 320, such as a silicon oxide layer, is then formed on the etch stop layer 320.

A photolithography process, an etching process and a metallization process are performed to form contact structures 301a and 301b, contact structure 303, and contact structure 304 in the insulating layer 320, the etch stop layer 320 and the dielectric capping layer 220. According to an embodiment of the present invention, the contact structure 301a is formed in the contact hole CL and directly contacts the bottom electrode layer 201 of the MIM capacitor stack layer 200. According to an embodiment of the present invention, the contact structure 301b directly contacts the top electrode layer 203 of the MIM capacitor stack layer 200. According to an embodiment of the present invention, the contact structure 303 and the contact structure 304 directly contact the pad structure PA and the pad structure PP, respectively.

Subsequently, through silicon vias 106 are formed in the substrate 100 to electrically connect the pad structure PP. Optionally, the insulating layer 320 directly above the inductor coil pattern IP in the inductor forming region IR may be selectively removed to form a cavity 320c in order to reduce the inductor substrate loss, thereby completing the fabrication of the interposer 10 having integrated capacitor and inductor.

Structurally, as shown in FIG. 8, the interposer 10 of the present invention includes: a substrate 100 having an inductor forming region IR thereon; a plurality of trenches 103 disposed in the inductor forming region IR of the substrate 100; a buffer layer 120, lining the interior surfaces of the plurality of trenches 103 and forming air gaps AG within the plurality of trenches 103; and the inductor coil pattern IP embedded in the buffer layer 120 in the inductor forming region IR.

According to an embodiment of the present invention, the plurality of trenches 103 in the inductor forming region IR and the buffer layer 120 in the plurality of trenches 103 are surrounded by the fluorosilicate glass layer 112 in the substrate 100. According to an embodiment of the present invention, the buffer layer 120 comprises an organosilicate glass layer.

According to an embodiment of the present invention, the inductor coil pattern IP may include a titanium nitride layer and a copper layer stacked on the titanium nitride layer.

According to an embodiment of the present invention, the interposer 10 further includes: a dielectric capping layer 220 covering the inductor coil pattern IP and the buffer layer 120 in the inductor forming region IR. According to an embodiment of the present invention, the dielectric capping layer 220 may include a silicon nitride layer or a nitrogen-doped silicon carbide layer.

According to an embodiment of the present invention, the interposer 10 further includes: an etch stop layer 310 disposed on the dielectric cover layer 220; and an insulating layer 320 disposed on the etch stop layer 310. According to an embodiment of the present invention, the etch stop layer 310 may comprise a silicon nitride layer.

According to an embodiment of the present invention, the interposer 10 further includes: a cavity 320c located in the insulating layer 310 within the inductor forming region IR.

According to an embodiment of the present invention, the inductor coil pattern IP may comprise a multi-layer metal structure.

Figure 9:
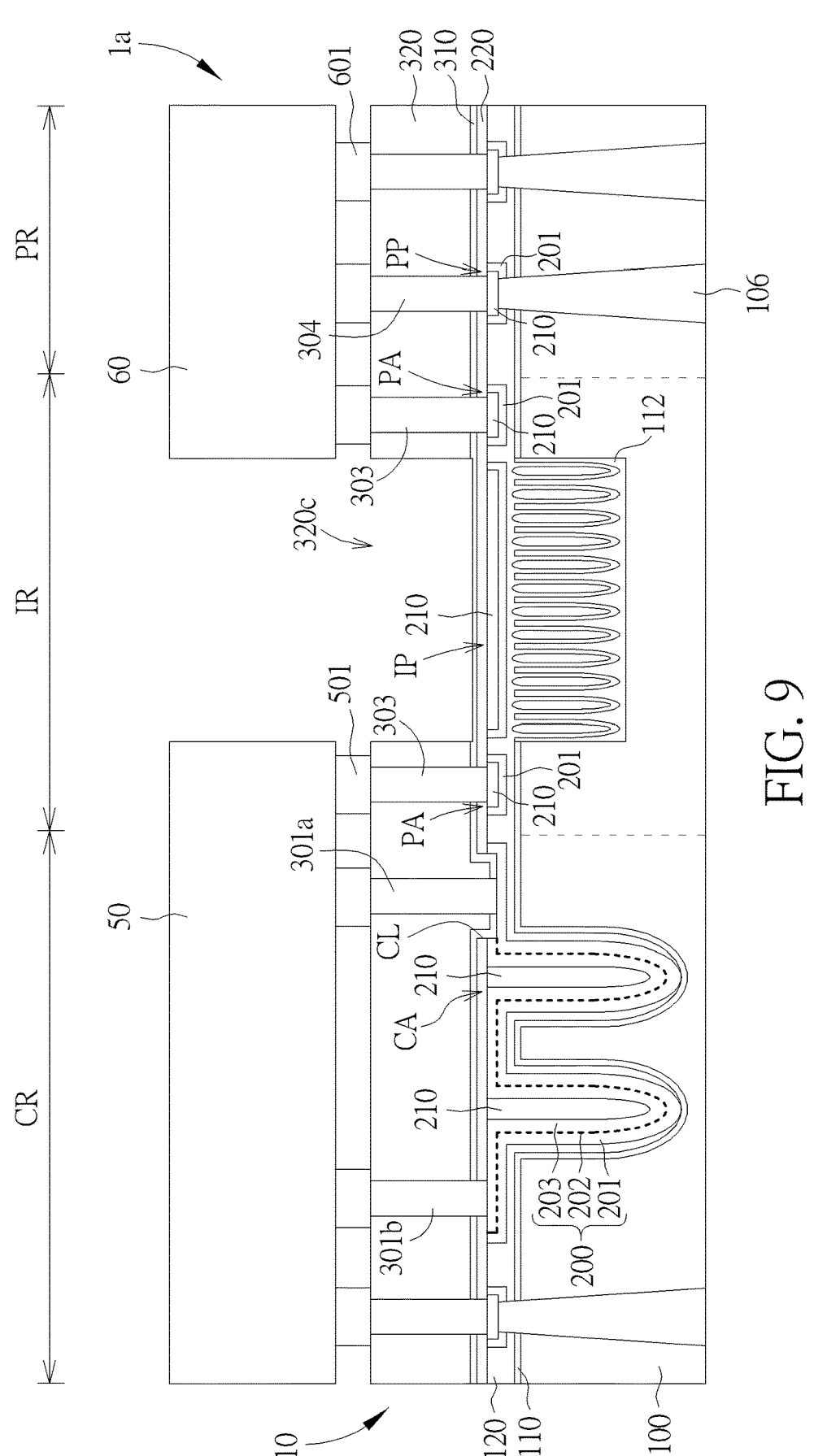
FIG. 9 and FIG. 10 illustrate the exemplary three-dimensional radio frequency multi-chip structures according to the present invention.
Figure 10:
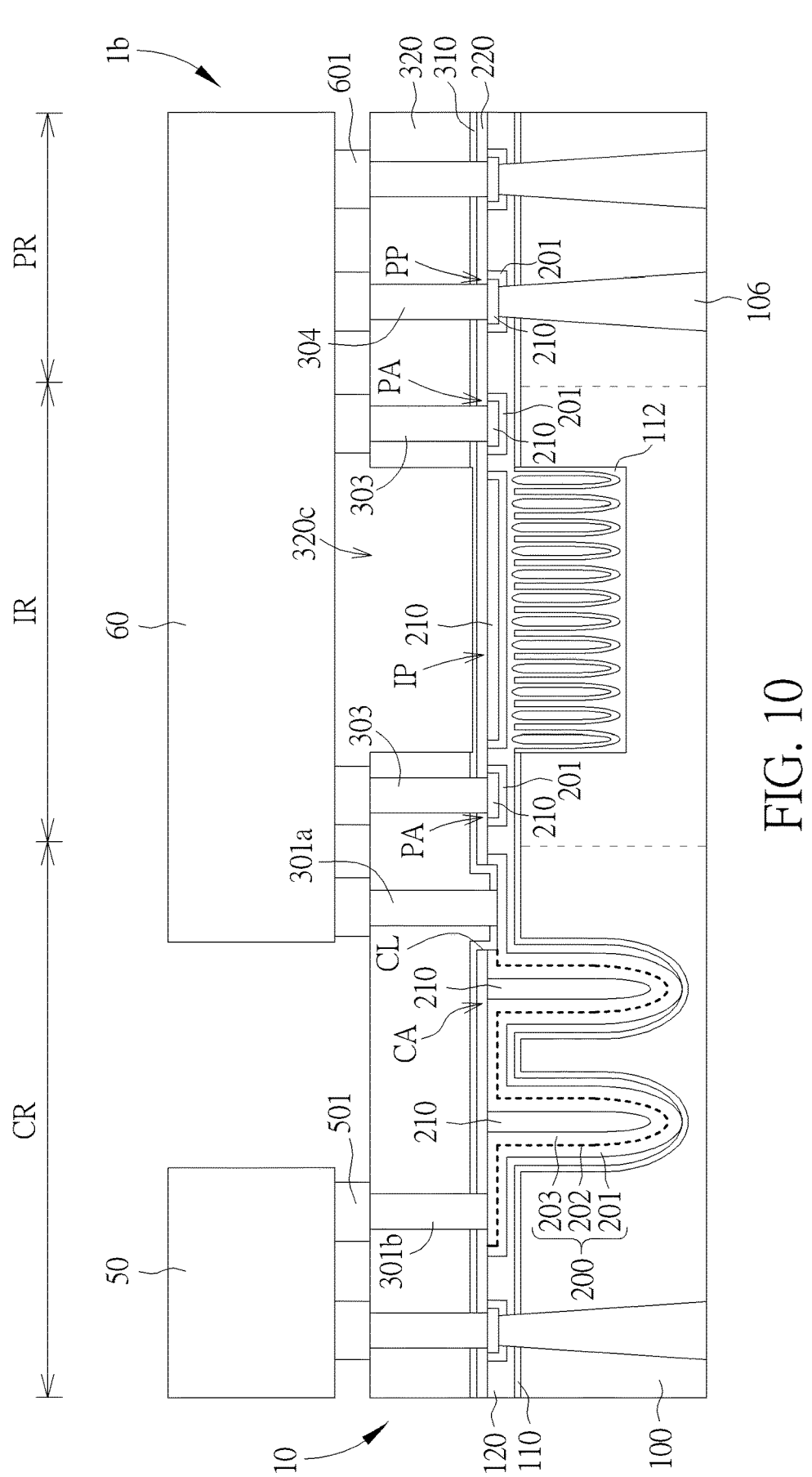

Please refer to FIG. 9 and FIG. 10, which illustrate the exemplary three-dimensional radio frequency multi-chip structures according to the present invention.

As shown in FIG. 9, the three-dimensional radio frequency multi-chip structure 1a includes a first radio frequency chip 50 disposed on the interposer 10 and electrically connected to the contact structures 301a and 301b and the contact structure 303 through micro bumps 501. The three-dimensional radio frequency multi-chip structure 1a further includes a second radio frequency chip 60 disposed on the interposer 10 and electrically connected to the contact structure 303 and the contact structure 304 through the micro bump 601. Neither the first radio frequency chip 50 nor the second radio frequency chip 60 overlaps with the cavity 320c.

As shown in FIG. 10, the three-dimensional radio frequency multi-chip structure 1b includes a first radio frequency chip 50 disposed on the interposer 10 and electrically connected to the contact structure 301b through micro bumps 501. The three-dimensional radio frequency multi-chip structure 1b further includes a second radio frequency chip 60 disposed on the interposer 10 and electrically connected to the contact structure 303a, the contact structure 303, and the contact structure 304 through the micro-bump 601. The second radio frequency chip 60 spans the cavity 320c and overlaps with the cavity 320c.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An interposer, comprising:
   a substrate having an inductor forming region thereon;
   a plurality of trenches within the inductor forming region in the substrate;
   a buffer layer lining interior surfaces of the plurality of trenches, wherein the buffer layer defines air gaps within the plurality of trenches;
   an inductor coil pattern embedded in the buffer layer within the inductor forming region; and
   a dielectric capping layer covering the inductor coil pattern and the buffer layer within the inductor forming region.

2. The interposer according to claim 1, wherein the plurality of trenches within the inductor forming region and the buffer layer in the plurality of trenches are surrounded by a fluorosilicate glass (FSG) layer in the substrate.

3. The interposer according to claim 2, wherein the buffer layer comprises an organo-silicate glass (OSG) layer.

4. The interposer according to claim 1, wherein the inductor coil pattern comprises a titanium nitride layer and a copper layer stacked on the titanium nitride layer.

5. The interposer according to claim 1, wherein the dielectric capping layer comprises a silicon nitride layer or a nitrogen-doped silicon carbide layer.

6. The interposer according to claim 1 further comprising:
   an etch stop layer disposed on the dielectric capping layer; and
   an insulating layer disposed on the etch stop layer.

7. The interposer according to claim 6, wherein the etch stop layer comprises a silicon nitride layer.

8. The interposer according to claim 6 further comprising:
   a cavity in the insulating layer within the inductor forming region.

9. The interposer according to claim 1, wherein the inductor coil pattern comprises a multi-layer metal structure.

10. A method for forming an interposer, comprising:
    providing a substrate having an inductor forming region thereon;
    forming a plurality of trenches within the inductor forming region in the substrate;
    forming a buffer layer lining interior surfaces of the plurality of trenches and forming air gaps within the plurality of trenches;
    forming an inductor coil pattern embedded in the buffer layer within the inductor forming region; and forming a dielectric capping layer covering the inductor coil pattern and the buffer layer within the inductor forming region.

11. The method according to claim 10, wherein the plurality of trenches within the inductor forming region and the buffer layer in the plurality of trenches are surrounded by a fluorosilicate glass (FSG) layer in the substrate.

12. The method according to claim 11, wherein the buffer layer comprises an organo-silicate glass (OSG) layer.

13. The method according to claim 10, wherein the inductor coil pattern comprises a titanium nitride layer and a copper layer stacked on the titanium nitride layer.

14. The method according to claim 10, wherein the dielectric capping layer comprises a silicon nitride layer or a nitrogen-doped silicon carbide layer.

15. The method according to claim 10 further comprising:
forming an etch stop layer on the dielectric capping layer; and
forming an insulating layer on the etch stop layer.

16. The method according to claim 15, wherein the etch stop layer comprises a silicon nitride layer.

17. The method according to claim 15 further comprising:
forming a cavity in the insulating layer within the inductor forming region.

18. The method according to claim 10, wherein the inductor coil pattern comprises a multi-layer metal structure.

\* \* \* \* \*